(12) United States Patent
Steiert

(10) Patent No.: US 10,486,961 B2
(45) Date of Patent: Nov. 26, 2019

(54) METHOD FOR PRODUCING A MEMS SENSOR, AND MEMS SENSOR

(71) Applicant: Infineon Technologies AG, Neubiberg (DE)

(72) Inventor: Matthias Steiert, Rosenheim (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 16/105,281

(22) Filed: Aug. 20, 2018

(65) Prior Publication Data
US 2019/0055117 A1    Feb. 21, 2019

(30) Foreign Application Priority Data
Aug. 21, 2017 (DE) .................. 10 2017 214 558

(51) Int. Cl.
*B81C 1/00* (2006.01)
*B81B 3/00* (2006.01)
(Continued)

(52) U.S. Cl.
CPC .......... *B81B 3/0072* (2013.01); *B81B 3/0078* (2013.01); *B81C 1/00158* (2013.01); *B81C 1/00523* (2013.01); *B81C 1/00666* (2013.01); *G01L 9/0042* (2013.01); *H04R 19/005* (2013.01); *H04R 19/04* (2013.01); *H04R 31/00* (2013.01); *B81B 2201/0257* (2013.01); *B81B 2201/0264* (2013.01); *B81B 2203/0127* (2013.01); *B81B 2203/0163* (2013.01);
(Continued)

(58) Field of Classification Search
CPC ................ B81B 3/0072; B81B 3/0078; B81B 2201/0257; B81B 2201/0264; B81B 2203/0127; B81B 2203/0163; B81B 2203/0315; B81B 2203/0323; B81B 2203/0353; B81C 1/00158; B81C 1/00523; B81C 1/00547; B81C 1/00666; B81C 2201/013; B81C 2201/014
See application file for complete search history.

(56) References Cited

U.S. PATENT DOCUMENTS 9,643,837 B1 *   5/2017   Herrmann ............. B81B 3/0072
2001/0001550 A1 *  5/2001   Bryzek ................. B81B 3/0072
                                                    338/36
(Continued)

FOREIGN PATENT DOCUMENTS

| DE | 102005004877 A1 | 8/2006 |
| DE | 102005042664 A1 | 3/2007 |
| DE | 102013217349 A1 | 3/2015 |

*Primary Examiner* — Stephen W Smoot
(74) *Attorney, Agent, or Firm* — Slater Matsil, LLP

(57) ABSTRACT

In accordance with an embodiment, a MEMS structure is produced on a front side of a substrate. A decoupling structure which has recesses is produced in the substrate, which decoupling structure decouples a first region from a second region of the substrate in terms of stresses. In a rear side, situated opposite the front side, of the substrate, a first cavity is produced by means of a first etching process and a second cavity is produced by means of a second etching process. The first cavity and the second cavity are produced such that the second cavity encompasses the first cavity and such that the second cavity adjoins a base region of the MEMS structure and a base region of the decoupling structure.

16 Claims, 5 Drawing Sheets

(51) Int. Cl.
*G01L 9/00* (2006.01)
*H04R 31/00* (2006.01)
*H04R 19/04* (2006.01)
*H04R 19/00* (2006.01)

(52) U.S. Cl.
CPC ............ *B81B 2203/0315* (2013.01); *B81B 2203/0323* (2013.01); *B81C 2201/013* (2013.01); *B81C 2201/014* (2013.01); *H04R 2201/003* (2013.01)

(56) References Cited

U.S. PATENT DOCUMENTS

| | | |
|---|---|---|
| 2005/0037531 A1 | 2/2005 | Kouma et al. |
| 2015/0059485 A1* | 3/2015 | Haag ................ B81B 7/007 73/725 |
| 2017/0297895 A1* | 10/2017 | Kautzsch ............ B81B 3/0021 |
| 2018/0295458 A1* | 10/2018 | Steiert ................ B81C 1/00238 |

* cited by examiner

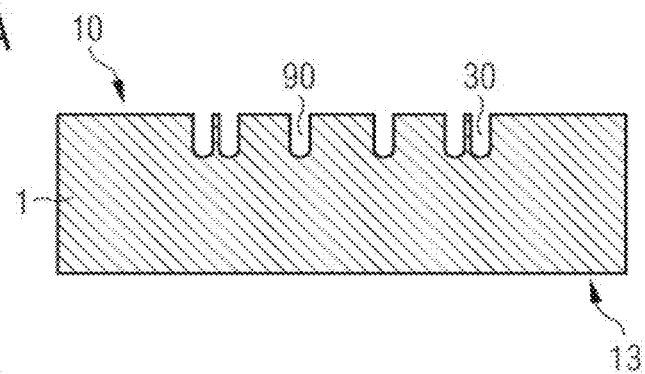
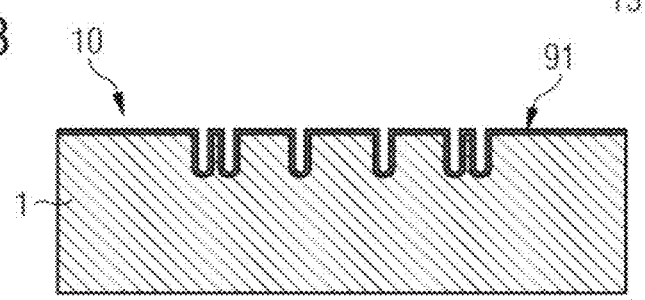
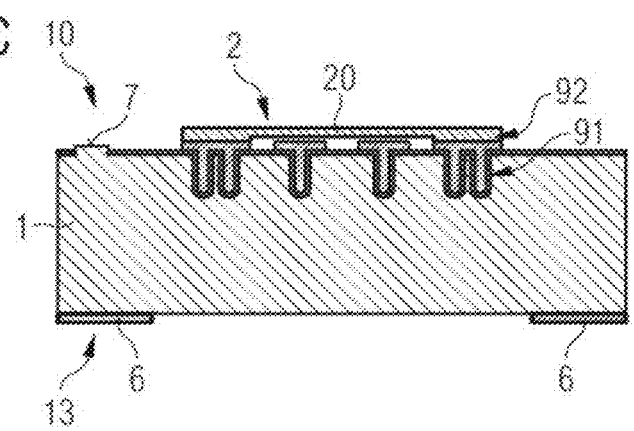
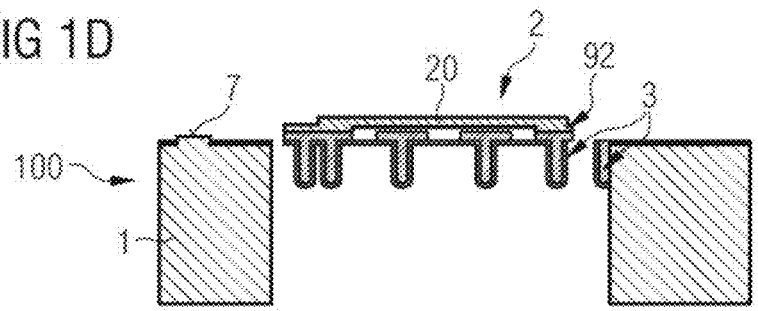

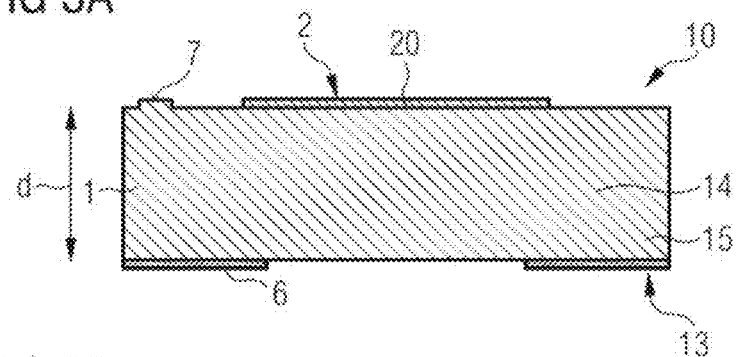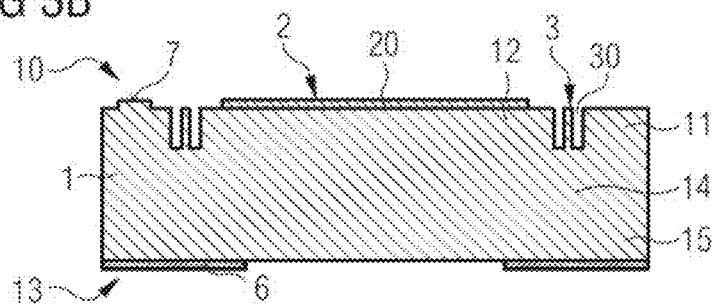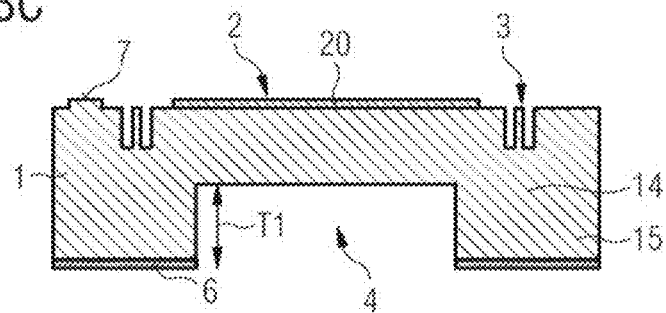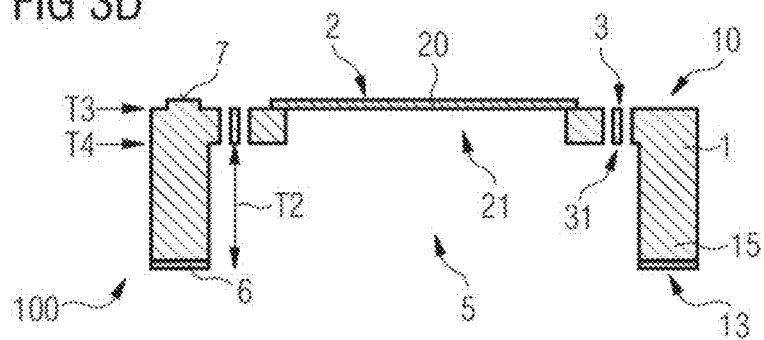

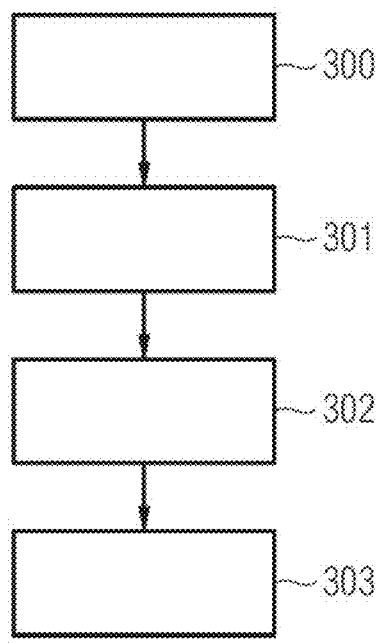
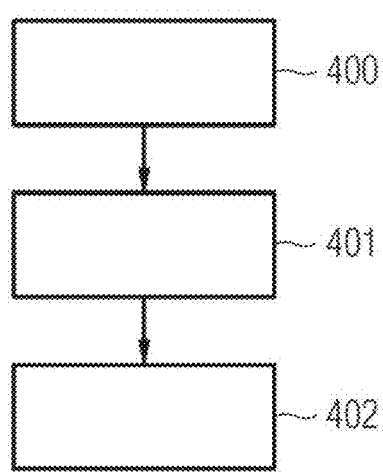

METHOD FOR PRODUCING A MEMS SENSOR, AND MEMS SENSOR

This application claims the benefit of German Application No. 102017214558.7, filed on Aug. 21, 2017, which application is hereby incorporated herein by reference in its entirety.

TECHNICAL FIELD

The disclosure relates to a method for producing a MEMS sensor, and to a MEMS sensor.

BACKGROUND

MEMS sensors are sensors produced using microsystem technology. The expression MEMS originates here from "microelectromechanical system". Examples of such MEMS sensors are for example pressure sensors or microphones.

SUMMARY

An embodiment relates to a method for producing a MEMS sensor, which method comprises the following steps: a substrate is provided, a MEMS structure is produced on a front side of the substrate, a decoupling structure which has recesses is produced in the substrate, which decoupling structure decouples a first region from a second region of the substrate in terms of stresses, in a rear side, situated opposite the front side, of the substrate, a first cavity is produced by means of a first etching process and a second cavity is produced by means of a second etching process, and the first cavity and the second cavity are produced such that the second cavity encompasses the first cavity and such that the second cavity adjoins a base region of the MEMS structure and a base region of the decoupling structure.

A further embodiment provides a MEMS sensor that has been produced in accordance with an embodiment of the method.

BRIEF DESCRIPTION OF THE DRAWINGS

In detail, there are numerous possibilities for configuring and refining the method and the MEMS sensor. In this regard, reference is made firstly to the patent claims and secondly to the following description of exemplary embodiments in conjunction with the drawing.

FIGS. 1a-1d show phases of a first embodiment of a method for producing a MEMS sensor, which is a MEMS microphone;

FIG. 3a-3d show phases of a third embodiment of a method for producing a MEMS sensor, which is a MEMS microphone;

FIG. 5 shows a flow diagram of the steps of an embodiment of a method for producing a MEMS sensor; and FIG. 6 shows a flow diagram of the steps of an alternative embodiment of a method for producing a MEMS sensor.

DETAILED DESCRIPTION OF ILLUSTRATIVE EMBODIMENTS

Figure 2A:
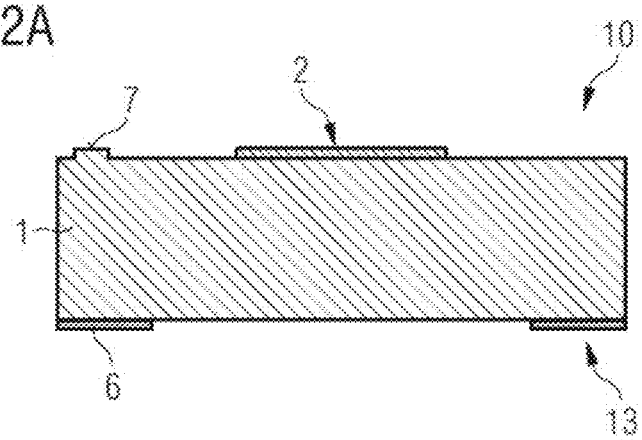
FIGS. 2a-2c show phases of a second embodiment of the production of a MEMS pressure sensor as an example for a MEMS sensor.

FIG. 1 shows four phases during the production of a MEMS sensor 100, which is a microphone.

FIG. 1a shows the substrate 1, which is for example a silicon wafer. Multiple depressions or recesses 30, 90 have been formed in on the front side 10 of the substrate 1. Some recesses 30 belong, in part, to a decoupling structure 3 to be produced in the following processing steps. Here, the recesses 30 form a negative form for the spring-like elements to be produced. Other recesses 90 permit, in part, the production of a MEMS structure 2 which serves for the actual function of the MEMS sensor 100 to be produced. The rear side 13 of the substrate 1 is situated opposite the front side 10.

FIG. 1b shows the phase in which a layer of silicon oxide (SiO) 91 has been applied to the front side 10 of the substrate 1. The layer 91 serves as an etch stop layer for the step in which a cavity is etched below the MEMS structure 2 that is applied in the next step.

FIG. 1c shows the phase in which the MEMS structure 2 has been applied to the front side 10 of the substrate. A membrane 20 is in this case part of the MEMS structure 2. Here, into the recesses 30, 90 (cf. FIG. 1a), above the SiO layer 91, there has been applied an epitaxial polysilicon layer 92 which is a mechanical base structure of the MEMS structure 2 and which imparts the resilient action of the decoupling structure 3. Contacting pads (so-called "bond pads") 7 have also been applied to the front side 10.

For the following etching step, an etch stop mask 6 is situated on the rear side 13 of the substrate 1. It can be seen that the etch stop mask 6 forms an etch stop outside the region which is situated, from the front side 10 to the rear side 13, below the MEMS structure 2 and below the decoupling structure 3. This makes it possible for a cavity to be produced in said region by means of the following etching process.

FIG. 1d shows the microphone as MEMS sensor 100. Below the MEMS structure 2 with the membrane 20 and the polysilicon regions 92, there is now situated a cavity. Here, the cavity is required in particular also for the movements of the membrane 20. By means of the etching process, the decoupling structure 3 has likewise been exposed. The decoupling structure 3 is in this case for example a spring structure and serves generally for the decoupling of two regions of the substrate 1 from one another with regard to mechanical stress. In particular, decoupling is realized between the membrane 20 and the surrounding substrate 1.

FIG. 2 shows steps during the production of a pressure sensor as an example for a MEMS sensor 100. Here, three phases of the production are illustrated.

FIG. 2a shows that the MEMS structure 2 and contacting pads 7 have been applied or produced on the front side 10 of the substrate 1. An etch stop mask 6 has been applied to the rear side 13 of the substrate 1, which etch stop mask in this case leaves in particular the region below the MEMS structure 2 free.

Figure 2B:
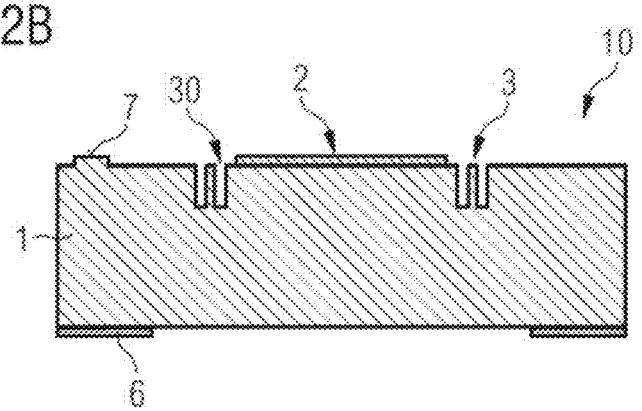

FIG. 2b illustrates that a decoupling structure 3 with recesses 30 has additionally been produced on the front side 10. The finished decoupling structure 3 permits the decoupling in terms of stresses between the region of the substrate 1 with the MEMS structure 2 and the surrounding region of the substrate 1.

Figure 2C:
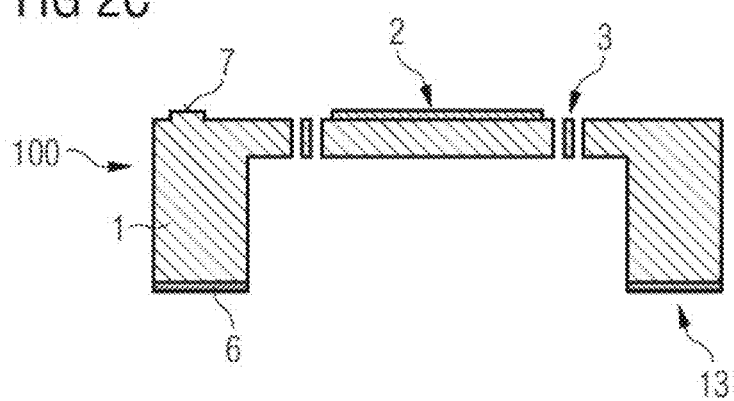

FIG. 2c illustrates how a cavity has been produced in the substrate 1 below the MEMS structure 2 by means of an etching process. The cavity 3 also opens the bottom sides of the decoupling structure 3, such that these, in this case in the form of spring elements, impart their stress-decoupling action. It can however also be seen that the MEMS structure 2 rests on a type of tablet which is formed by the substrate 1, which has not been etched away at that location. The MEMS structure 2 is thus not exposed in the direction of the rear side 13. Further steps would be necessary for this purpose.

FIG. 3 shows four phases during the production of a MEMS sensor 100. Said MEMS sensor is in this case a microphone.

FIG. 3a shows a section through the substrate 1 of thickness d. A MEMS structure 2 has been applied to the front side 10. To simplify the illustration, only the membrane 20 is shown as part of the MEMS structure 2 here. The polysilicon regions that belong to the decoupling structure 3 are not shown, such that only the recesses 30 are illustrated. Contacting pads ("bond pads") 7 are additionally also situated on the front side 10.

On the rear side 13 of the substrate 1, there is provided an etch stop mask 6 which, in this case, is of two-part form (indicated by a dotted and a filled area). The etch stop mask 6 is in particular designed such that a first section 14 of the substrate 1 is protected from a first—and preferably only from the first—etching process. If a second etching process is performed, the first section 14 will be etched away, such that it is no longer protected by the etch stop mask 6. Furthermore, the etch stop mask 6 protects a second section 15 of the substrate 1 from the first etching process and from a second etching process. The two stated sections 14, 15 are in this case situated, along the connection between the front side 10 and the rear side 13, in the direction of the front side 10 below the etch stop mask 6 or below that part of the rear side 13 on which the etch stop mask 6 is situated. The described action of the etch stop mask 6 arises, in one embodiment, by means of the specific condition thereof. In a supplementary or alternative embodiment, after the first etching process, a part of the etch stop mask 6 is removed, such that there is no longer protection for the first section 14.

FIG. 3b shows how the recesses 30 of the decoupling structure 3 have been formed into the front side 10 of the substrate 1. The substrate 1 is in this case, as an example, a silicon wafer. The decoupling in terms of stresses is effected between a first region 11, which in this case in the exemplary embodiment is situated at the outside, and a second region 12, which in this case is situated at the inside. Above the second region 12 there is situated, in particular, the MEMS structure 2 with the membrane 20, which is thus decoupled in terms of stresses from the surrounding substrate 1.

It can also be seen that the second section 15 defined by the etch stop mask 6—which in this case is indicated in two parts—belongs to the first region 11 with regard to the decoupling in terms of stresses. The first section 14 defined by the etch stop mask 6 is, as viewed from the front side 10, situated below the decoupling structure 3 and in particular below the recesses 30 of the decoupling structure 3.

FIG. 3c shows the result of the first etching process. Owing to the etch stop mask 6, a first cavity 4 is created below the MEMS structure 2, and in particular below the membrane 20, by means of the first etching process. The depth of the first cavity 4 and thus the first etching depth is denoted here by T1. The two sections 14, 15 are protected by the etch stop mask 6 during the first etching process.

FIG. 3d shows the result of the second etching process and the microphone as MEMS sensor 100. Here, the etch stop mask 6 has protected only the second section 15, such that the first section 14 has been etched away. By means of the second etching process, a second cavity 5 has been produced which is larger than the first cavity 4 and which encompasses or extends said first cavity. The second cavity 5 has, in part, a depth T2 resulting from the etching depth, and in this case, also has a greater lateral extent than the first cavity 4, which no longer exists as a result of the second etching process and owing to the second cavity 5.

The first etching process with the first cavity 4 with the depth T1 and the subsequent second etching process which etches away the substrate 1 by the etching depth T2 result, overall, in the second cavity 5, which partially has a depth made up of the sum of the two etching depths T1, T2 and partially has a depth arising only from the second etching depth T2. Here, the depth relates to the distance to the rear side 13 in the direction of the front side 10. The second cavity 5 thus has at least two different extents into the substrate 1.

Here, the second cavity 5 adjoins a base region 21 of the MEMS structure 2 and a base region 31 of the decoupling structure 3. The base region 21 of the MEMS structure 2 in this case has a depth T3 proceeding from the front side 10.

In the example shown, the base region 21 of the MEMS structure 2 is defined by the membrane 20. Therefore, below the membrane 20, for the purposes of free vibration, the second cavity 5 extends all the way through the substrate 1. Thus, in the exemplary embodiment shown, the depth T3 disappears, and the sum of the depth T1 of the first cavity 4 and of the second etching depth T2 of the second etching process is equal to the thickness d of the substrate 1 between the front side 10 and the rear side 13.

The depth T4 of the base region 31 of the decoupling structure 3 relative to the front side 10 arises firstly from the dimensioning required for the decoupling and secondly from the required mechanical strength. Below the decoupling structure 3, the depth T2 of the second cavity 5, and thus the etching depth achieved by means of the second etching process, is defined by the difference between the thickness d of the substrate 1 and the depth T4 of the base region 31 of the decoupling structure 3 below the front side 10 of the substrate 1.

With the first etching process, etching is performed until a first etching depth T1 has been reached. With the second etching process, a second etching depth T2 is produced. The etching depths T1, T2 are defined here as viewed proceeding from the rear side 13 in the direction of the front side 10. In the regions below the MEMS structure 2, the two etching depths T1, T2 add together, and in other regions—in particular below the decoupling structure 3, only the second etching depth T2 is removed. Here, the magnitude of the difference between the two etching depths T1, T2 is equal to the magnitude of the difference between the depths T3, T4 exhibited by a base region 31 of the decoupling structure 3 and a base region 21 of the MEMS structure 2 relative to the front side 10.

In the example shown, as a result of the first and the second etching process, the second cavity 5 extends through the substrate 1 below the membrane 20 of the MEMS structure 2. Thus, the sum of the two etching depths T1, T2 is equal to the thickness d of the substrate 1.

FIG. 4 shows three phases of a further variant of the production of a microphone as MEMS sensor 100. In the embodiment shown, the recesses 30 of the decoupling structure 3 are produced—building on the preparations of the first etching process—by means of the second etching process.

Figure 4A:
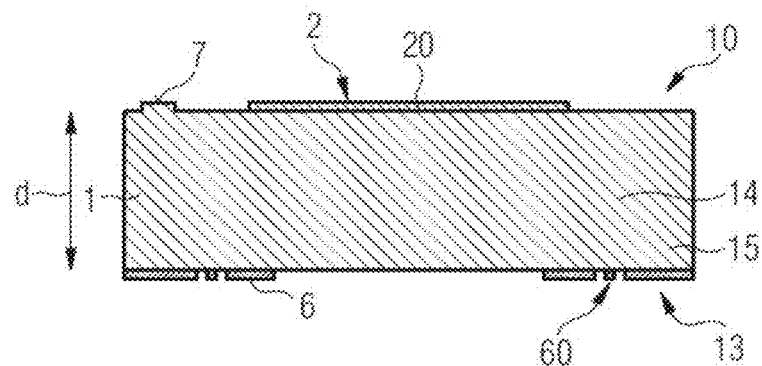
FIG. 4a-4c show phases of a fourth embodiment of a method for producing a MEMS sensor, which is, by way of example, a MEMS microphone.

FIG. 4a shows the substrate 1 with the MEMS structure 2, the membrane 20 thereof and the contacting pads 7 on the front side 10. On the rear side 13, there is situated an etch stop mask 6 which is designed such that the first section 14 of the substrate 1 is protected only from the first etching process and that the second section 15 of the substrate 1 is protected from the first and from the second etching process.

Furthermore, the etch stop mask is designed such that, by means of the first etching process, not only the first cavity 4 but also provisional recesses 32 are produced in the substrate 1. The latter is realized in the exemplary embodiment illustrated in that the etch stop mask 6, in some regions, does not cover the rear side 13 but leaves said rear side exposed, such that the first etching process can remove the material of the substrate 1 below said exposed locations.

Figure 4B:
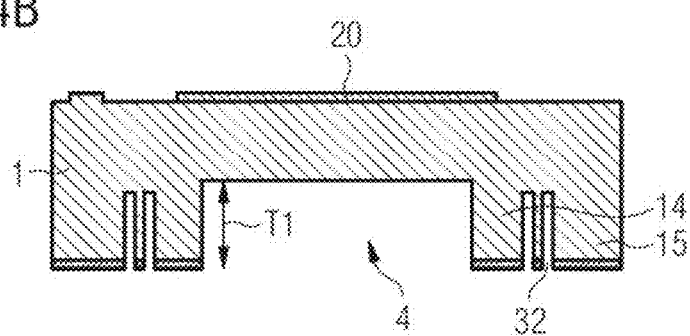

FIG. 4b shows the result of the first etching process. It is possible to see the first cavity 4 with the depth T1 resulting from the first etching depth, and the provisional recesses 32, which are situated above the recesses 30, to be produced, of the decoupling structure 3.

Figure 4C:
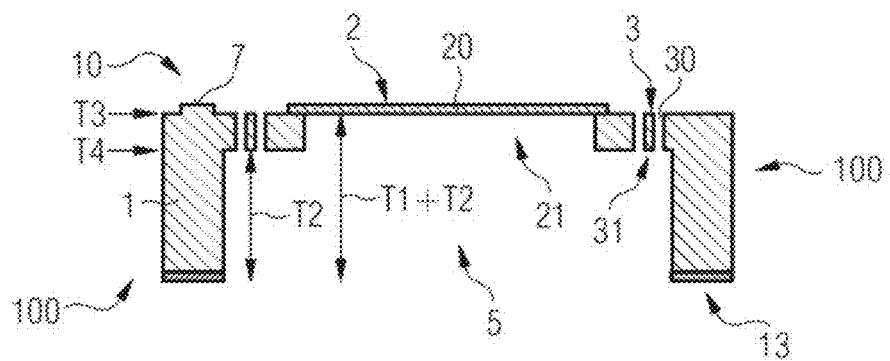

The result of the second etching process is shown in FIG. 4c. The second cavity 5 results from the first cavity 4 and has, in the vicinity of the decoupling structure 3, a depth defined by the second etching depth T2 and, in this case, in particular below the membrane 20 of the MEMS structure 2, a depth which is equal to the thickness d of the substrate 1 and equal to the sum of the two etching depths T1, T2.

It can also be seen that the recesses 30 of the decoupling structure 3 arise as a result of the provisional recesses 32 having been advanced in the direction of the front side 10 of the substrate 1 by the second etching process. Altogether, therefore, the recesses 30 of the decoupling structure 3 are produced only by means of etching processes proceeding from the rear side 13.

FIG. 5 shows an exemplary sequence of steps such as lead to the phases of FIG. 3.

In the step 300, a substrate is provided. Furthermore, a MEMS structure is applied to the front side of the substrate and an etch stop mask is applied to the rear side. The result of this step is shown in FIG. 3a.

In the step 301, recesses of a decoupling structure are produced on the front side of the substrate. The result of this step is shown in FIG. 3b.

In the step 302, a first etching process is performed, which produces a first cavity and which removes the material of the substrate as far as a first etching depth T1. The result of this step 302 is shown in FIG. 3c.

In the subsequent step 303, more material of the substrate is removed by means of a second etching process. The result of this step is shown in FIG. 3d.

Here, the etching depth T2 of the second etching process adds, in part, to the etching depth T1 of the first etching process and, in part, owing to the design of the etch stop mask or alternatively or in addition to the partial removal thereof between steps 302 and 303, gives rise only to the depth of a second cavity. The two etching depths T1, T2 add together in particular below the MEMS structure. The etching depth T2 of the second etching process gives rise, below the decoupling structure, to the depth of the second cavity in this region. Therefore, altogether, a base region of the MEMS structure—viewed from the rear side—is situated lower than a base region of the decoupling structure. If the MEMS structure to be produced is in particular—as illustrated in FIG. 3—a MEMS microphone, then the membrane of the MEMS structure and the recesses of the decoupling structure are exposed as a result of the step 303.

FIG. 6 shows an exemplary sequence of steps such as lead to the phases of FIG. 4.

In the step 400, a substrate is provided, a MEMS structure is applied to the front side of the substrate, and an etch stop mask is applied to the rear side. Here, the etch stop mask differs from those used in the sequence of FIG. 5. Accordingly, in particular, the region of the substrate above the recesses of the decoupling structure is not protected from the first etching process. An exemplary result of the step 400 is shown in FIG. 4a.

In the step 401, the first etching process is performed. This results firstly in a first cavity below the MEMS structure or, in the example of FIG. 4, below the membrane of the MEMS structure, and secondly, provisional recesses are realized above the recesses of the decoupling structure. An exemplary result of the step 401 is shown in FIG. 4b.

In the subsequent step 402, the second cavity, which is situated partly below the MEMS structure, is produced by means of the second etching process. Furthermore, the provisional recesses are, by means of the second etching process, advanced in the direction of the front side of the substrate such that the recesses of the decoupling structure are realized from the provisional recesses. An exemplary result of the step 402 is shown in FIG. 4c.

In a first embodiment, a method for producing a MEMS sensor has at least the following steps: that a substrate is provided, that a MEMS structure is produced on a front side of the substrate, that a decoupling structure which has recesses is produced in the substrate, which decoupling structure decouples a first region from a second region of the substrate in terms of stresses, that, in a rear side, situated opposite the front side, of the substrate, a first cavity is produced by means of a first etching process and a second cavity is produced by means of a second etching process, and that the first cavity and the second cavity are produced such that the second cavity encompasses the first cavity and such that the second cavity adjoins a base region of the MEMS structure and a base region of the decoupling structure.

In a second embodiment, if it relates back to the first embodiment, a first etching depth is produced by means of the first etching process and a second etching depth is produced by means of the second etching process, such that a magnitude of a difference between the first etching depth and the second etching depth is substantially equal to a magnitude of a difference between a depth of the base region of the MEMS structure and a depth of the base region of the decoupling structure.

In a third embodiment, if it relates back to the first embodiment, before the production of the first cavity, an etch stop mask is produced on the rear side of the substrate such that a first section of the substrate is protected only from the first etching process and a second section of the substrate is protected from the first and the second etching process.

In a fourth embodiment, if it relates back to the first embodiment, the MEMS structure and the decoupling structure are produced before the first cavity and before the second cavity.

In a fifth embodiment, if it relates back to the first embodiment, the recesses of the decoupling structure are produced by means of the second etching process.

In a sixth embodiment, if it relates back to the fifth embodiment, before the production of the first cavity, an etch stop mask is produced on the rear side of the substrate such that a first section of the substrate is protected only from the first etching process and a second section of the substrate is protected from the first and the second etching process, and such that, by means of the first etching process, the first cavity and provisional recesses are produced in the substrate.

In a seventh embodiment, if it relates back to the sixth embodiment, the second etching process is performed such that the recesses of the decoupling structure are produced from the provisional recesses.

In an eighth embodiment, if it relates back to the first embodiment, the MEMS structure is produced for a pressure sensor.

In a ninth embodiment, if it relates back to the first embodiment, the MEMS structure is produced for a microphone, and a membrane is produced as part of the MEMS structure.

In a tenth embodiment, if it relates back to the ninth embodiment, the first etching process and the second etching process are performed such that the substrate is, below the membrane, removed over an entire thickness of the substrate.

In a further embodiment, a MEMS sensor is provided which has been produced by means of the method according to the first embodiment.

The above-described exemplary embodiments constitute merely an illustration of the principles of the present invention. It is self-evident that modifications and variations of the arrangements and details described herein will be apparent to other technical experts. It is intended here that the invention be restricted only by the scope of protection of the following patent claims and not by the specific details presented herein on the basis of the description and the explanation of the exemplary embodiments. Rather, the following patent claims also encompass the abovementioned modifications and variations of the described arrangements and details.

What is claimed is:

1. A method for producing a MEMS sensor, the method comprising:
   providing a substrate;
   producing a MEMS structure on a front side of the substrate, producing the MEMS structure comprising
      producing a decoupling structure comprising recesses in the substrate, wherein the decoupling structure decouples a first region from a second region of the substrate in terms of stresses;
      producing a first cavity using a first etching process in a rear side of the substrate, the rear side of the substrate situated opposite the front side of the substrate; and
      producing a second cavity using a second etching process in the rear side of the substrate, wherein the second cavity encompasses the first cavity, and the second cavity adjoins a base region of the MEMS structure and a base region of the decoupling structure.

2. The method as claimed in claim 1,
   wherein a first etching depth is produced by the first etching process and a second etching depth is produced by the second etching process; and
   a magnitude of a difference between the first etching depth and the second etching depth is substantially equal to a magnitude of a difference between a depth of the base region of the MEMS structure and a depth of the base region of the decoupling structure.

3. The method as claimed in claim 1, further comprising, before producing the first cavity, producing an etch stop mask on the rear side of the substrate, wherein a first section of the substrate is protected by the etch stop mask only from the first etching process and a second section of the substrate is protected by the etch stop mask from the first etching process and the second etching process.

4. The method as claimed in claim 1, wherein the MEMS structure and the decoupling structure are produced before the first cavity and before the second cavity are produced.

5. The method as claimed in claim 1, wherein the recesses of the decoupling structure are produced using the second etching process.

6. The method as claimed in claim 5, further comprising, before producing the first cavity, producing an etch stop mask on the rear side of the substrate, wherein a first section of the substrate is protected by the etch stop mask only from the first etching process and a second section of the substrate is protected by the etch stop mask from the first etching process and the second etching process, and the first cavity and provisional recesses are produced in the substrate using the first etching process.

7. The method as claimed in claim 6, wherein the recesses of the decoupling structure are produced from the provisional recesses using the second etching process.

8. The method as claimed in claim 1, wherein the MEMS structure is produced for a pressure sensor.

9. The method as claimed in claim 1,
   wherein the MEMS structure is produced for a microphone, and
   wherein a membrane is produced as part of the MEMS structure.

10. The method as claimed in claim 9, further comprising an entire thickness of the substrate is removed below the membrane using the first etching process and the second etching process.

11. A method for producing a MEMS sensor, the method comprising:
    disposing a MEMS membrane on a front side of a substrate;
    disposing an etch stop mask on a rear side of the substrate opposite the front side of the substrate;
    etching recesses on the front side of the substrate adjacent to the MEMS membrane;
    etching a first cavity using a first etching process in the rear side of the substrate opposite the MEMS membrane, wherein the etch stop mask protects a first portion of the substrate disposed below the recesses from the first etching process; and
    etching a second cavity encompassing the first cavity using a second etching process, wherein portions of the second cavity are disposed below the recesses, the second cavity adjoins a base region of the MEMS sensor, and the etch stop mask protects the base region of the MEMS sensor from the second etching process.

12. The method of claim 11, wherein the recesses are configured to decouple stress between a first region of the substrate and a second region of the substrate.

13. The method of claim 12, wherein the recesses extend from the front side of the substrate to a top side of the second cavity.

14. A method for producing a MEMS sensor, the method comprising:
    disposing a MEMS membrane on a front side of a substrate;
    disposing an etch stop mask on a rear side of the substrate opposite the front side of the substrate;
    etching a first cavity using a first etching process in the rear side of the substrate opposite the MEMS membrane, wherein the etch stop mask protects a first portion of the substrate from the first etching process;
    etching provisional recesses on the rear side of the substrate adjacent the first cavity using the first etching process; and
    etching a second cavity encompassing the first cavity using a second etching process, wherein the second cavity adjoins a base region of the MEMS sensor, and the etch stop mask protects the base region of the MEMS sensor from the second etching process.

15. The method of claim 14, wherein the second etching process further etches the provisional recesses to reach the front side of the substrate from the rear side of the substrate to form a decoupling structure.

16. The method of claim 15, wherein the decoupling structure is configured to decouple stress between a first region of the substrate and a second region of the substrate.

* * * * *